(12) United States Patent
Jeong

(10) Patent No.: US 6,943,420 B2
(45) Date of Patent: Sep. 13, 2005

(54) MAGNETIC RANDOM ACCESS MEMORY (MRAM) DEVICES HAVING NONPARALLEL MAIN AND REFERENCE MAGNETIC RESISTORS

(75) Inventor: Won-Cheol Jeong, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 15 days.

(21) Appl. No.: 10/689,158

(22) Filed: Oct. 20, 2003

(65) Prior Publication Data

US 2004/0108561 A1 Jun. 10, 2004

(30) Foreign Application Priority Data

Dec. 10, 2002 (KR) .................... 10-2002-0078524

(51) Int. Cl.[7] .......................... H01L 29/82; H01L 43/00
(52) U.S. Cl. ............................... 257/422; 365/158
(58) Field of Search .......................... 257/422; 365/158

(56) References Cited

U.S. PATENT DOCUMENTS

| | | | |
|---|---|---|---|
| 5,982,660 A | 11/1999 | Bhattacharyya et al. | |
| 6,055,178 A | 4/2000 | Naji | |
| 6,445,612 B1 | 9/2002 | Naji | |
| 6,479,353 B2 | 11/2002 | Bhattacharyya | |
| 6,597,049 B1 * | 7/2003 | Bhattacharyya et al. | 257/421 |
| 6,754,099 B2 * | 6/2004 | Hidaka | 365/173 |
| 6,791,856 B2 * | 9/2004 | Li et al. | 365/63 |

OTHER PUBLICATIONS

Jeong, W.C., et al., "A new reference signal generation method for MRAM using a 90-degree rotated MTJ", Jul. 2004, IEEE Trans. Magnetics, p. 2628–30.*

Jeong, H.S., et al., "Fully Integrated 64Kb MRAM with Novel Reference Cell Scheme", 2002, IEDM '02, Dig. Inter., p. 551–4.*

Durlam et al., *A low power 1Mbit MRAM based on 1T1MTJ bit cell integrated with Copper Interconnects*, 2002 Symposium on VLSI Circuits Digest of Technical Papers, 2002, pp. 158–161.

Slonczewski, *Conductance and exchange coupling of two ferromagnets separated by a tunneling barrier*, Physical Review B, vol. 39, No. 10, Apr. 1, 1989, pp. 6995–7001.

* cited by examiner

*Primary Examiner*—Howard Weiss
(74) *Attorney, Agent, or Firm*—Myers Bigel Sibley & Sajovec

(57) ABSTRACT

MRAM devices include an MRAM substrate having a face, elongated main magnetic resistors that extend along the face and elongated reference magnetic resistors that extend along the face nonparallel to the elongated main magnetic resistors. The elongated reference magnetic resistors may extend along the face orthogonal to the elongated main magnetic resistors. The elongated main magnetic resistors may be configured to have a maximum resistance or a minimum resistance, and the elongated reference magnetic transistors may be configured to have resistance midway between the maximum resistance and the minimum resistance.

37 Claims, 6 Drawing Sheets

MAGNETIC RANDOM ACCESS MEMORY (MRAM) DEVICES HAVING NONPARALLEL MAIN AND REFERENCE MAGNETIC RESISTORS

RELATED APPLICATION

This application claims the benefit of Korean Patent Application No. 2002-0078524, filed Dec. 10, 2002, the disclosure of which is hereby incorporated herein by reference in its entirety as if set forth fully herein.

FIELD OF THE INVENTION

This invention relates to integrated circuit memory devices and operating methods thereof, and more particularly to Magnetic Random Access Memory Cells (MRAM) and operating methods thereof.

BACKGROUND OF THE INVENTION

MRAMs have been widely investigated and used as nonvolatile memory devices that can be operated at low voltage and at high speed. In an MRAM cell, data is stored in a magnetic resistor that includes a Magnetic Tunnel Junction (MTJ) having first and second ferromagnetic layers and a tunneling insulation layer therebetween. In some embodiments, the magnetic polarization of the first ferromagnetic layer, also referred to as a free layer, is changed utilizing a magnetic field that crosses the MTJ. The magnetic field may be induced by an electric current passing around the MTJ, and the magnetic polarization of the free layer can be parallel or anti-parallel to the magnetic polarization of the second ferromagnetic layer, also referred to as a pinned layer. According to spintronics based on quantum mechanics, a tunneling current passing through the MTJ in the parallel direction may be greater than that in the anti-parallel direction. Thus, the magnetic polarizations of the free layer and the pinned layer can define the electrical resistance of the magnetic resistor, to provide an indication of the stored information in the MRAM.

An MRAM device is described in the publication to Durlam et al. entitled *A Low Power 1 Mbit MRAM Based on 1T1MTJ Bit Cell Integrated With Copper Interconnects*, 2002 Symposium on VLSI Circuits Digest of Technical Papers, pp. 158–161. FIG. 7 of the Durlam et al. publication, reproduced herein as FIG. 1, illustrates the MRAM memory core block with mid-point reference generator circuitry. FIG. 6 of Durlam et al., reproduced herein as FIG. 2, graphically illustrates measured minimum, maximum and middle resistance and calculated middle resistance curves versus bias for a midpoint generator reference cell.

Another midpoint reference generator for an MRAM device is described in U.S. Pat. No. 6,445,612 to Naji, entitled MRAM With Midpoint Generator Reference and Method for Read out. As noted in the abstract of this patent, the MRAM architecture includes a data column of memory cells and a reference column, including a midpoint generator, positioned adjacent the data column on a substrate. The memory cells and the midpoint generator include similar magnetoresistive memory elements, e.g. MTJ elements. The MTJ elements of the generator are each set to one of Rmax and Rmin and connected together to provide a total resistance of a midpoint between Rmax and Rmin. A differential read-out circuit is coupled to the data column and to the reference column for differentially comparing a data voltage to a reference voltage.

Another midpoint reference generator for an MRAM device is described in U.S. Pat. No. 6,055,178 to Naji, entitled Magnetic Random Access Memory With a Reference Memory Array. As described in this patent, An MRAM device includes a memory array and a reference memory array. The memory array arranges magnetic memory cells in rows and columns for storing information, and the reference memory array forms reference memory cells for holding a reference information in a row line. The magnetic memory cell has a maximum resistance and a minimum resistance according to magnetic states in the cell. Each reference memory cell has a magnetic memory cell and a transistor, which are coupled in series and have a reference resistance across the reference memory cell and the transistor. The transistor is controlled by a reference row line control, so as for the reference resistance to show a mid-value between the maximum resistance and the minimum resistance of the magnetic memory cell. A bit line current and a reference bit current are provided to the magnetic memory cell and the reference memory cell, respectively. Magnetic states alternates the bit line current, which is compared to the reference bit current to provide an output.

Other MRAM devices are described in U.S. Pat. No. 5,982,660 to Bhattacharyya et al. entitled Magnetic Memory Cell With Off-Axis Reference Layer Orientation for Improved Response, and U.S. Pat. No. 6,479,353 to Bhattacharyya entitled Reference Layer Structure in a Magnetic Storage Cell.

SUMMARY OF THE INVENTION

MRAM devices according to some embodiments of the present invention comprise an MRAM substrate including a face, a plurality of elongated main magnetic resistors that extend along the face and a plurality of elongated reference magnetic resistors that extend along the face nonparallel to the plurality of elongated main magnetic resistors. In some embodiments, the plurality of elongated reference magnetic resistors extend along the face orthogonal to the plurality of elongated main magnetic resistors. In some embodiments, the plurality of elongated reference magnetic resistors and the plurality of elongated main magnetic resistors are rectangular or oval shaped. In yet other embodiments, the plurality of elongated main magnetic resistors are configured to have a maximum resistance or a minimum resistance, and the plurality of elongated reference magnetic transistors are configured to have resistance between the maximum resistance and the minimum resistance and, in some embodiments, midway between the maximum resistance and the minimum resistance.

In still other embodiments of the present invention, a plurality of main access transistors are provided, a respective one of which is connected to a respective one of the plurality of elongated main magnetic resistors, to define a plurality of main cells, each of which comprises a single main access transistor and a single main magnetic resistor. A plurality of reference access transistors also are provided, a respective one of which is connected to a respective one of the plurality of elongated reference magnetic resistors, to define a plurality of reference cells, each of which comprises a single reference access transistor and a single reference magnetic resistor.

In still other embodiments, a common line, also referred to as a common source line, a main bit line and a reference bit line, are provided. At least one of the main cells is connected between the common line and the main bit line, and at least one of the reference cells is connected between the common line and the reference bit line. In still other embodiments, a word line is provided, wherein the at least one of the main cells that is connected between the common line and the main bit line and the at least one of the reference cells that is connected between the common line and the reference bit line, are also connected to the word line. In other embodiments, a sense amplifier is connected between the main bit line and the reference bit line.

Other embodiments of the present invention provide an MRAM that includes a plurality of main magnetic resistors and a plurality of main access transistors on an MRAM substrate. The main magnetic resistors are configured to have a maximum resistance or a minimum resistance. A respective one of the main magnetic resistors is connected to a respective one of the plurality of main access transistors, to define a plurality of main cells, each of which comprises a single main access transistor and a single main magnetic resistor. A plurality of reference magnetic resistors and a plurality of reference access transistors also are provided on the substrate. The reference magnetic resistors are configured to have resistance between the maximum resistance and the minimum resistance. A respective one of the reference magnetic resistors is connected to a respective one of the plurality of reference access transistors, to define a plurality of reference cells, each of which comprises a single reference access transistor and a single reference magnetic resistor. Elongated nonparallel main magnetic resistors and reference magnetic resistors, common lines, main bit lines, reference bit lines, word lines and/or sense amplifiers also may be provided as was described above.

According to other embodiments of the invention, an MRAM device structure having a main cell region and a reference cell region adjacent to the main cell region is provided. The MRAM device structure comprises a plurality of main magnetic resistors, which are arrayed in the main cell region along rows and columns. Each of the main magnetic resistors has a first width and a first length when viewed from a plan view. A plurality of reference magnetic resistors are disposed in the reference cell region. Each of the reference magnetic resistors has a second width and a second length. A direction of the first length intersects a direction of the second length at a predetermined nonzero angle.

In some embodiments, the first and second lengths are greater than the first and second widths, respectively. In other embodiments, the main magnetic resistors and the reference magnetic resistors may have a rectangular shape or an oval shape when viewed from a plan view. Also, in yet other embodiments, the first length and the first width may be equal to the second length and the second width, respectively.

In some embodiments, the predetermined angle is 90°. In these embodiments, the reference magnetic resistors are arrayed in a direction that is perpendicular to the main magnetic resistors.

In some embodiments, the reference cell region may further comprise a reference bit line. The reference bit line extends parallel to the columns. Also, the reference bit line is electrically connected to top surfaces of the reference magnetic resistors, which are arrayed along the column under the reference bit line.

Similarly, in some embodiments, the main cell region may further comprise a plurality of parallel main bit lines. The main bit lines extend parallel to the columns. The main bit lines are electrically connected to top surfaces of the main magnetic resistors, which are arrayed along the column thereunder.

In some embodiments, a plurality of parallel digit lines may extend beneath the main magnetic resistors and the reference magnetic resistors. The digit lines extend parallel to the rows. In some embodiments, the digit lines are insulated from the main magnetic resistors and the reference magnetic resistors.

In yet other embodiments, a plurality of main access transistors may be formed in the main cell region. The main access transistors are electrically connected to bottom surfaces of the main magnetic resistors, respectively. Similarly, in some embodiments, a plurality of reference access transistors may be formed in the reference cell region. The reference access transistors are electrically connected to bottom surfaces of the reference magnetic resistors, respectively. In some embodiments, the main access transistors and the reference access transistor in a respective row share a single word line. In some embodiments, each of the main magnetic resistors and the reference magnetic resistors may comprise a bottom electrode, an MTJ structure and a top electrode, which are sequentially stacked. The MTJ structure may include a pinning layer, a pinned layer, a tunneling layer and a free layer, which are sequentially stacked. The pinning layer is a non-ferromagnetic layer, and the pinned layer and the free layer are ferromagnetic layers. Also, the tunneling layer is an insulating layer such as an aluminum oxide ($Al_2O_3$) layer. The pinned layer has fixed magnetic spins, which are arrayed in a single direction. The fixed magnetic spins do not rotate, even though a magnetic field is applied to the pinned layer using a current that flows through the digit line adjacent to the pinned layer. This is due to the presence of the pinning layer (the non-ferromagnetic layer) that is in contact with the pinned layer. Therefore, the resistance of the respective magnetic resistors is determined according to an array direction of the magnetic spins in the free layer.

Generally, the array direction of the magnetic spins in the free layer highly depends on the configuration of the ferromagnetic layer. In detail, the magnetic spins in the free layer tend to be arrayed toward the length direction of the free layer. Thus, in some embodiments of the present invention, if the magnetic spins in the pinned layers of the reference magnetic resistors are fixed toward the width direction of the reference magnetic resistors, it is easy to array the magnetic spins in the free layers of the reference magnetic resistors toward a direction that is perpendicular to the fixed magnetic spins in the pinned layers. In this case, resistances of the reference magnetic resistors exhibit a mid-value between a minimum resistance and a maximum resistance thereof.

According to other embodiments of the invention, an MRAM device includes a reference bit line, and a plurality of reference cells are connected in parallel to the reference bit line. Each of the reference cells comprises a single reference access transistor and a single reference magnetic resistor, which are serially connected. Each of the reference magnetic resistors has a first terminal and a second terminal. The first terminals of the reference magnetic resistors are electrically connected to the reference bit lines, and the second terminals of the reference magnetic resistors are electrically connected to the reference access transistors, respectively. The reference bit line is electrically connected to a sense amplifier.

In some embodiments, gate electrodes of the reference access transistors are electrically connected to a plurality of word lines, respectively. In some embodiments, a plurality of main bit lines are also electrically connected to the sense amplifier. In a read mode, the sense amplifier compares a main cell current that flows through a selected one of the main bit lines with a reference cell current that flows through the reference bit line, thereby generating an output signal corresponding to logic "0" or logic "1". The output signal of the sense amplifier is transmitted to an I/O port.

In other embodiments, a plurality of main cells are connected in parallel with the main bit lines, respectively. Each of the main cells comprises a single main access transistor and a single main magnetic resistor, which are serially connected. Each of the main magnetic resistors also has a first terminal and a second terminal. The first terminals of the main magnetic resistors are electrically connected to the main bit lines, and the second terminals of the main magnetic resistors are electrically connected to the main access transistors. Also, in some embodiments, gate electrodes of the main access transistors are electrically connected to the word lines. As a result, in some embodiments, each of the word lines is electrically connected to the plurality of main cells and one of the reference cells. In some embodiments, each of the reference magnetic resistors has a fixed reference resistance that corresponds to a mid-value between a maximum resistance and a minimum resistance of the main magnetic resistors.

DETAILED DESCRIPTION

Figure 1:
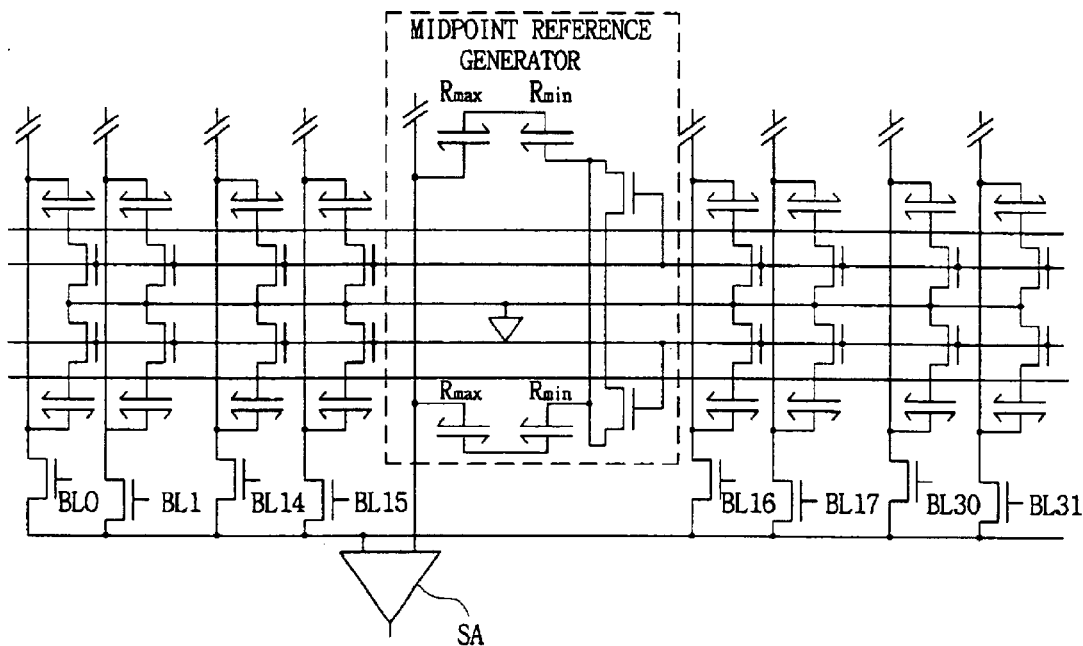
FIG. 1 is a circuit diagram of a conventional MRAM memory core block with mid-point reference generator circuitry.
Figure 2:
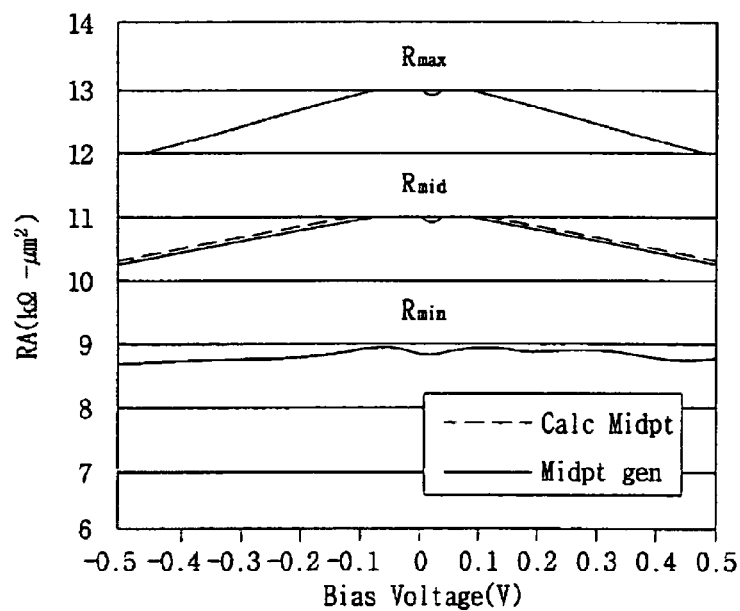
FIG. 2 graphically illustrates measured minimum, maximum and middle resistance and calculated middle resistance curves versus bias for a midpoint generator reference cell of FIG. 1.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element is referred to as being "connected" or "coupled" to another element, it can be directly connected or coupled to the other element or intervening elements may be present. It also will be understood that when an element such as a layer, region or substrate is referred to as being "on" another element, it can be directly on the other element or intervening elements may also be present. Furthermore, relative terms such as "beneath", "bottom" or "outer" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

Figure 3:
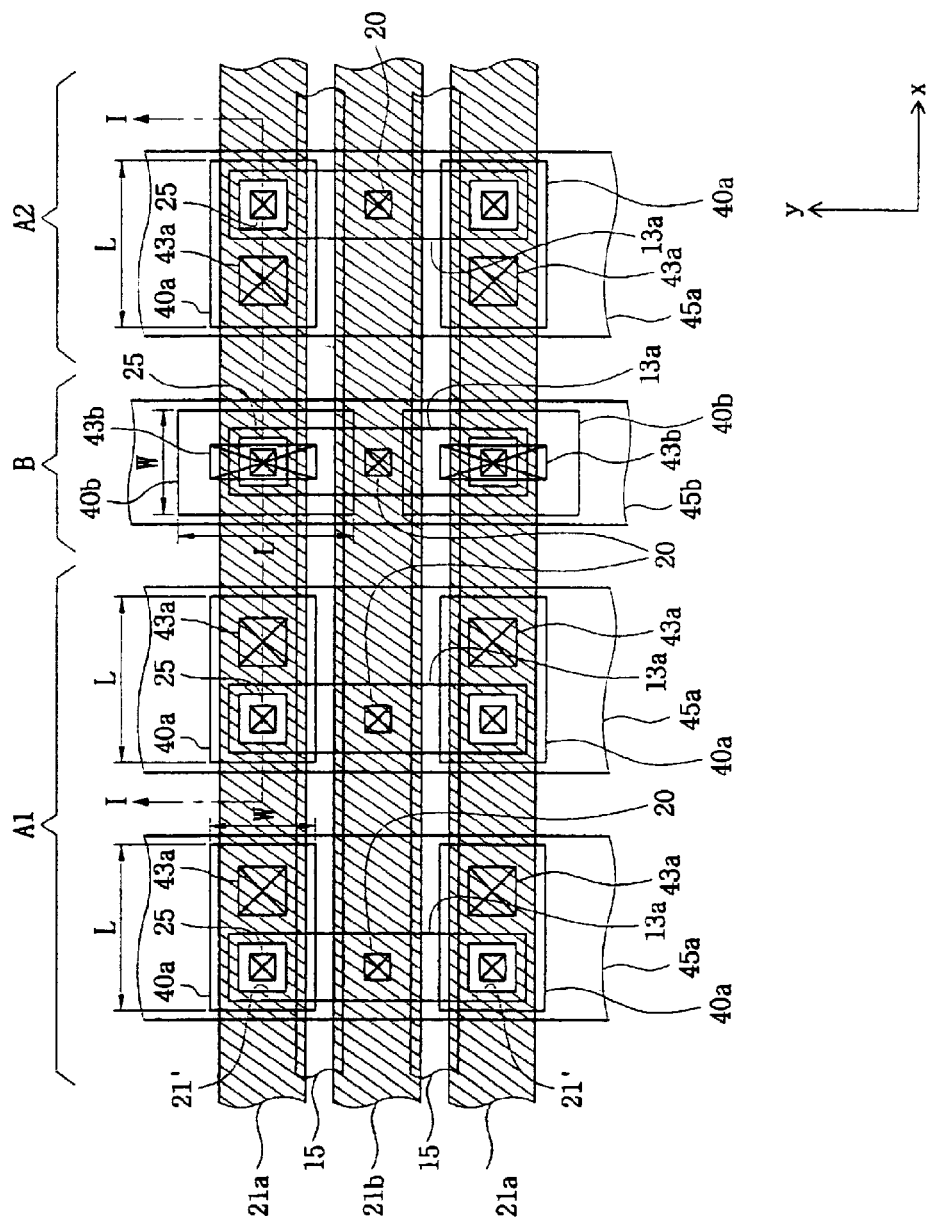
FIG. 3 is a plan view illustrating a portion of a magnetic random access memory device according to embodiments of the present invention.

FIG. 3 is a plan view illustrating a portion of cell array region of a MRAM device according to embodiments of the present invention.

Referring to FIG. 3, the cell array region comprises a plurality of active regions 13a, which are two dimensionally arrayed on a face of an MRAM substrate such as a semiconductor substrate, along rows and columns. It will be understood that, as used herein, the terms "row" and "column" are used to denote two different directions on an MRAM substrate face, rather than indicating an absolute horizontal or vertical direction. In some embodiments, the rows are parallel with an x-axis, and the columns are parallel with a y-axis. Also, the cell array region includes a reference cell region B as well as a first main cell region A1 and a second main cell region A2 located at opposite sides of the reference cell region B, respectively. The active regions 13a in the reference cell region B are one dimensionally disposed along a column, and the active regions 13a in the first and second main cell regions A1 and A2 are two dimensionally disposed along the rows and the columns. All of the active regions 13a in the reference cell region B and the first and second main cell regions A1 and A2 are arrayed in parallel with the y-axes in some embodiments.

A plurality of word lines 15 are disposed across the active regions 13a. In detail, a pair of word lines 15 are disposed over the respective active regions 13a. Therefore, the word lines 15 are disposed to be parallel with the x-axis. Common source regions are formed at the active regions 13a between the pair of word lines 15, and drain regions are formed at both ends of the active regions 13a. As a result, a pair of access transistors are formed at the respective active regions 13a. A common line, also referred to as a common source line 21b, is disposed between the pair of word lines 15. The common source line 21b is electrically connected to the source regions through common source line contact holes 20 that expose the common source regions. Also, a pair of digit lines 21a are disposed at opposite sides of the common source line 21b, respectively. The digit lines 21a have openings 21', which are located over the drain regions arrayed in the respective rows.

A plurality of elongated magnetic resistors are two dimensionally arrayed along the rows and the columns over the substrate having the digit lines 21a and the common source line 21b. Each of the magnetic resistors is located over the respective drain regions. The magnetic resistors comprise main magnetic resistors 40a arrayed in the main cell regions A1 and A2 as well as reference magnetic resistors 40b arrayed in the reference cell region B. As a result, the main magnetic resistors 40a are two dimensionally arrayed along the rows and the columns, and the reference magnetic resistors 40b are one dimensionally arrayed along a column. Bottom surfaces of the magnetic resistors 40a and 40b are electrically connected to the drain regions through contact holes 25 that expose the drain regions, respectively. The contact holes 25 pass through central regions of the openings 21' of the digit lines 21a. Accordingly, the magnetic resistors 40a and 40b are insulated from the digit lines 21a.

Each of the elongated magnetic resistors 40a and 40b has a width W and a length L greater than the width W when viewed from a plan view. Thus, the respective magnetic resistors 40a and 40b have a rectangular shape when viewed from a plan view as shown in FIG. 3. Alternatively, the respective magnetic resistors 40a and 40b may exhibit an oval or other elongated shape having the length L and the width W when viewed from a plan view.

The main magnetic resistors 40a are disposed to be parallel to a single direction. For instance, the main magnetic resistors 40a may be arrayed to be parallel with the x-axis (the rows) as shown in FIG. 3. In contrast, the reference magnetic resistors 40b are arrayed to intersect the single direction at a predetermined nonzero angle. Thus, the plurality of elongated reference magnetic resistors 40b extend along the substrate face nonparallel to the plurality of elongated main magnetic resistors 40a. In some embodiments, the reference magnetic resistors 40b are arrayed to be perpendicular to the single direction. In other words, the reference magnetic resistors 40b are arrayed to be parallel with a direction that is perpendicular to the main magnetic resistors 40a on the x-y plane as shown in FIG. 3.

Each of the magnetic resistors 40a and 40b comprises a bottom electrode, an MTJ structure and a top electrode, which are sequentially stacked. In some embodiments, the main magnetic resistors 40a have the same structure and dimensions as the reference magnetic resistors 40b. Thus, each of the bottom electrodes is electrically connected to the respective drain regions. In more detail, each of the main magnetic resistors 40a comprises a main bottom electrode, a main MTJ structure and a main top electrode, which are sequentially stacked, and each of the reference magnetic resistors 40b comprises a reference bottom electrode, a reference MTJ structure and a reference top electrode, which are sequentially stacked. Each of the main MTJ structures comprises a main pinning layer, a main pinned layer, a main tunneling layer and a main free layer, which are sequentially stacked, and each of the reference MTJ structures comprises a reference pinning layer, a reference pinned layer, a reference tunneling layer and a reference free layer, which are sequentially stacked.

A plurality of bit lines is disposed over the substrate having the magnetic resistors 40a and 40b. The bit lines are disposed to be parallel with the y-axis. The bit lines comprise main bit lines 45a disposed in the main cell regions A1 and A2 as well as reference bit lines 45b disposed in the reference cell region B. Each of the main bit lines 45a is electrically connected to top surfaces of the main magnetic resistors 40a (e.g., the main top electrodes) arrayed in the respective rows through main bit line contact holes 43a. Similarly, the reference bit line 45b is electrically connected to top surfaces of the reference magnetic resistors 40b (e.g., the reference top electrodes) through reference bit line contact holes 43b.

Figure 4:
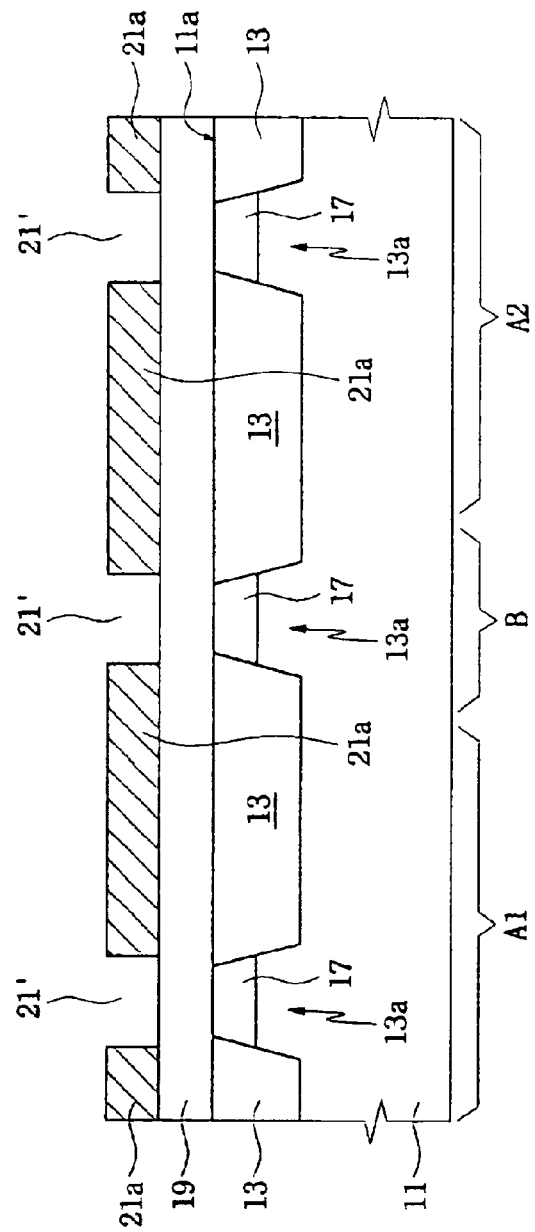
FIGS. 4 to 6 are cross sectional views, taken along a line I—I of FIG. 3, illustrating methods of fabricating a magnetic random access memory devices according to embodiments of the present invention.
Figure 5:
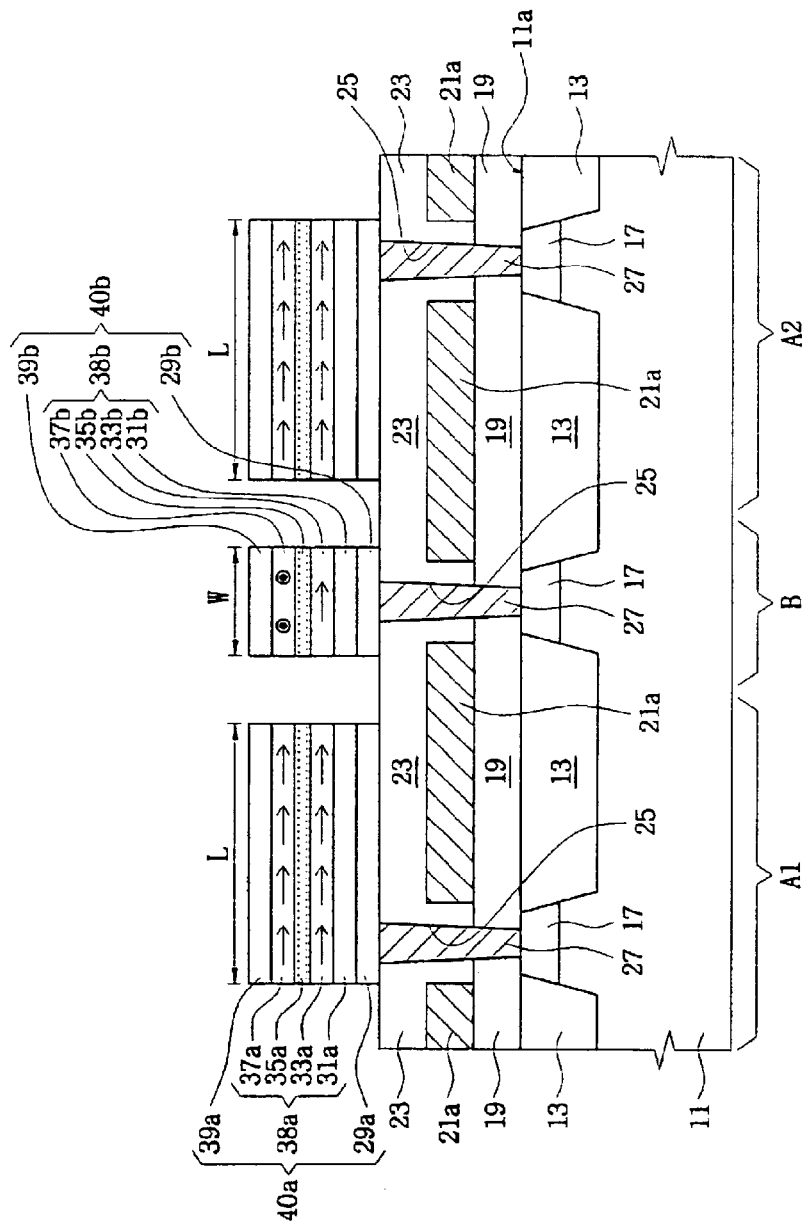
Figure 6:
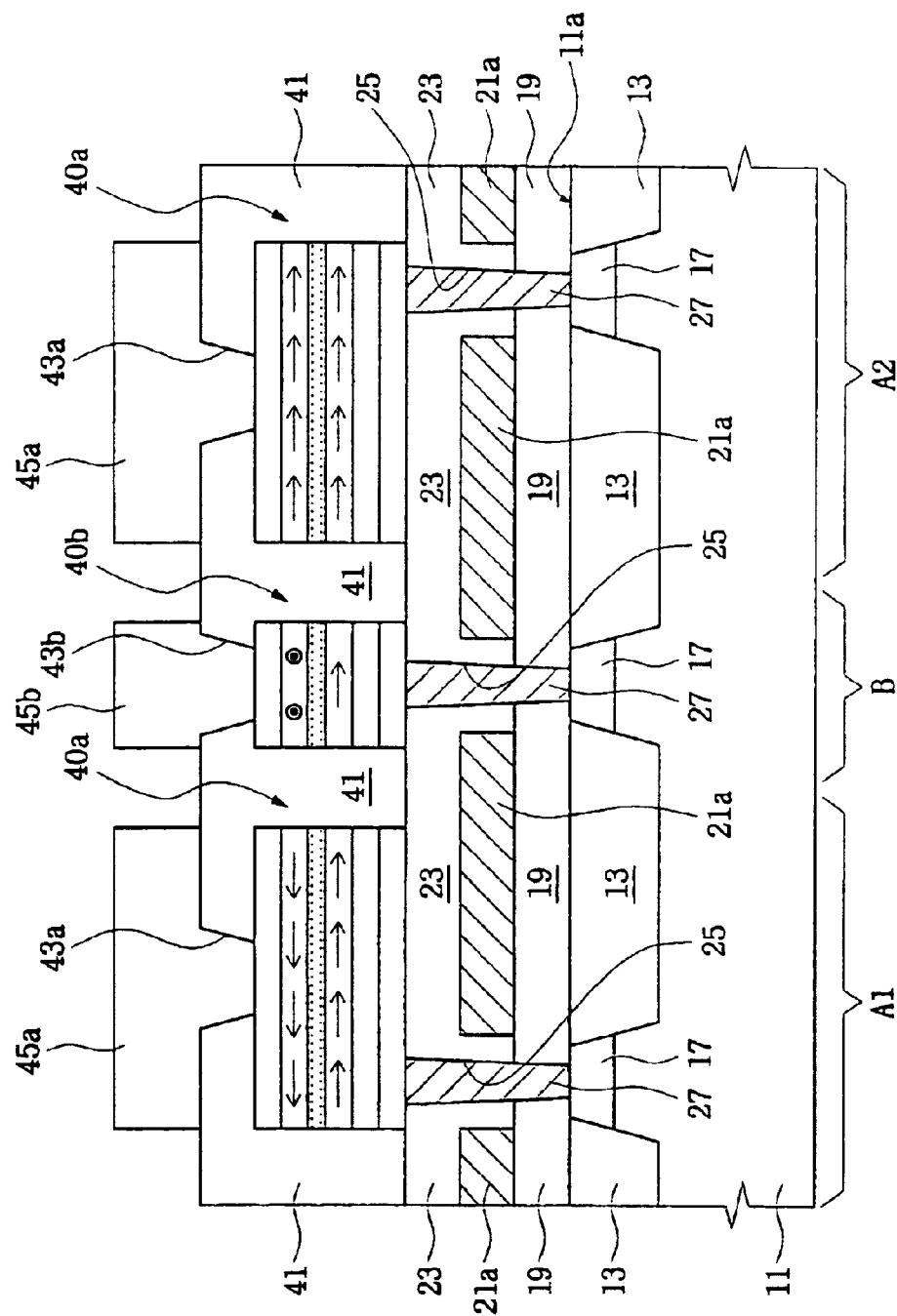

FIGS. 4 to 6 are cross sectional views, taken along the line I—I of FIG. 3, for illustrating methods of fabricating an MRAM device according to some embodiments of the present invention.

Referring to FIGS. 3 and 4, an isolation layer 13 is formed at a predetermined region of a p-type semiconductor substrate 11 adjacent a face 11a thereof, the substrate 11 having a main cell region and a reference cell region B. The isolation layer 13 defines active regions 13a. The main cell region comprises a first main cell region A1 and a second main cell region A2, which are separated from each other. The reference cell region B is interposed between the first and second main cell regions A1 and A2. Alternatively, the first and second main cell regions A1 and A2 may be merged into one main cell region. In this case, the reference cell region B may be located at one side of the main cell region.

A gate insulating layer (not shown) is formed at surfaces of the active regions 13a. A gate conductive layer is formed on the face 11a of the substrate having the gate insulating layer. The gate conductive layer is patterned to form a plurality of word lines (15 of FIG. 3) crossing over the active regions 13a. N-type impurity ions are implanted into the active regions 13a using the word lines 15 and the isolation layer 13 as ion implantation masks, thereby forming common source regions and drain regions 17 at the surfaces of the active regions 13a. Accordingly, a pair of access transistors is formed at the respective active regions 13a. The pair of access transistors share the single common source region.

A first interlayer insulating layer 19 is formed on the face 11a of the substrate including the access transistors. The first interlayer insulating layer 19 is patterned to form common source line contact holes (20 of FIG. 3) that expose the common source regions. A conductive layer is then formed on the face 11a of the substrate having the common source line contact holes 20. The conductive layer is patterned to form digit lines 21a crossing over the drain regions 17 and common source lines (21b of FIG. 3) electrically connected to the common source regions. The digit lines 21a are formed to have openings 21', which are located over the drain regions 17.

Referring to FIGS. 3 and 5, a second interlayer insulating layer 23 is formed on the substrate having the common source lines and the digit lines 21a. The second interlayer insulating layer 23 and the first interlayer insulating layer 21 are successively patterned to form contact holes 25 that penetrate central regions of the openings 21' and expose the drain regions 17. Contact plugs 27 are formed in the contact holes 25 using a conventional manner. A bottom electrode layer, a pinning layer, a pinned layer, a tunneling layer, a free layer and a top electrode layer are sequentially formed on the face 11a of the substrate having the contact plugs 27. In some embodiments, the bottom electrode layer is formed of a titanium layer or a tantalum layer, and the pinning layer is formed of a non-ferromagnetic layer such as a FeMn layer, an IrMn layer or a PtMn layer. Also, in some embodiments, the pinned layer and the free layer are formed of a ferromagnetic layer such as a CoFe layer or a NiFe layer. Further, in some embodiments, the tunneling layer is formed of an insulating layer such as an aluminum oxide layer ($Al_2O_3$), and the top electrode layer is formed of a tantalum layer.

The top electrode layer, the free layer, the tunneling layer, the pinned layer, the pinning layer and the bottom electrode layer are sequentially patterned to form magnetic resistors covering contact plugs 27. The magnetic resistors comprise main magnetic resistors 40a formed in the main cell regions A1 and A2 and reference magnetic resistors 40b formed in the reference cell region B. Each of the main magnetic resistors 40a includes a main bottom electrode 29a, a main MTJ structure 38a and a main top electrode 39a, which are sequentially stacked. Similarly, each of the reference magnetic resistors 40b includes a reference bottom electrode 29b, a reference MTJ structure 38b and a reference top electrode 39b, which are sequentially stacked. Also, the main MTJ structure 38a includes a main pinning layer 31a, a main pinned layer 33a, a main tunneling layer 35a and a main free layer 37a, which are sequentially stacked. Similarly, the reference MTJ structure 38b includes a reference pinning layer 31b, a reference pinned layer 33b, a reference tunneling layer 35b and a reference free layer 37b, which are sequentially stacked. As a result, the drain regions 17 are electrically connected to the bottom electrodes 29a and 29b through the contact plugs 27.

Each of the elongated magnetic resistors 40a and 40b is patterned to have a width W and a length L greater than the width W. Accordingly, each of the elongated magnetic resistors 40a and 40b has a length direction. In some embodiments, the elongated main magnetic resistors 40a are formed to be parallel with the digit lines 21a and the elongated reference magnetic resistors 40b are formed to be perpendicular to the digit lines 21a.

The substrate having the magnetic resistors 40a and 40b is loaded into a furnace or a chamber. The substrate in the furnace or the chamber is then annealed at a temperature of between about 200° C. and about to 300° C. A permanent magnet or an electric magnet is provided outside the furnace or the chamber during the annealing process. Thus, magnetic spins in the pinned layers 33a and 33b are arrayed and fixed toward a desired direction. In some embodiments, the substrate is loaded so that the length direction of the main magnetic resistors 40a is parallel with a magnetic field direction of the magnet installed outside the furnace or the chamber. In this case, all of the magnetic spins in the main pinned layers 33a and the reference pinned layers 33b are arrayed and fixed to be parallel with the length direction of the main magnetic resistors 40a, as shown in FIG. 5. The fixed spins do not further rotate, even though the annealed substrate is unloaded from the furnace or the chamber and only a new magnetic field is applied to the annealed substrate. This is due to the presence of the pinning layers 31a and 31b, which are in direct contact with the pinned layers 33a and 33b.

The magnetic spins in the free layers 37a and 37b may also be temporarily arrayed to be parallel with the fixed spins in the pinned layers 33a and 33b during the annealing process. However, the magnetic spins in the free layers 37a and 37b go back to their stable states after the annealing process. That is to say, the annealing process accompanied with the magnetic field does not permanently restrain the magnetic spins in the free layers 37a and 37b. Rather, the arrangement direction of the magnetic spins in the free layers 37a and 37b tends to depend on the shape of the free layers 37a and 37b. In detail, in the event that the free layers 37a and 37b have the length directions as mentioned above, the magnetic spins in the free layers 37a and 37b may be arrayed to be parallel with the length directions thereof after the annealing process, as shown in FIG. 5. As a result, the magnetic spins in the main free layers 37a are arrayed to be parallel or anti-parallel with the fixed spins, whereas the magnetic spins in the reference free layers 37b are arrayed in a direction, which is perpendicular to the fixed spins. Thus, the reference magnetic resistors 40b can be configured to have a resistance between a maximum resistance and a minimum resistance thereof.

For instance, a conductivity G of the magnetic resistor including a lower ferromagnetic layer, a tunnel insulating layer and an upper ferromagnetic layer, which are sequentially stacked, may be expressed by the following equation as described in an article by Slonczewski entitled *Conductance and Exchange Coupling of Two Ferromagnets Separated by a Tunneling Barrier*, Physical Review B, Vol. 39, No. 10, Apr. 1, 1989, pp. 6995–7002:

$$G(\theta) = G(\pi/2)[1 + P_1 \times P_2 \times \cos(\theta)];$$

where "θ" indicates an angle between the spins in the lower ferromagnetic layer and the spins in the upper ferromagnetic layer, and "$P_1$" and "$P_2$" indicate polarization values of the lower and upper ferromagnetic layers, respectively.

As can be seen in the above equation, the conductivity G of the magnetic resistor fully depends on the angle θ. Therefore, in the event that the angle θ is 0° (parallel), the magnetic resistor has a maximum resistance $R_{max}$. In contrast, in the event that the angle θ is 180° (anti-parallel), the magnetic resistor has a minimum resistance $R_{min}$. Meanwhile, when the angle θ is 90° (perpendicular), the magnetic resistor has a mid-value midway between the maximum resistance $R_{max}$ and the minimum resistance $R_{min}$.

As a result, if the reference magnetic resistors 40b are disposed to be perpendicular to the main magnetic resistors 40a and the magnetic spins in the reference pinned layers 33b are arrayed and fixed to be parallel with a width direction (for example, an x-axis direction of FIG. 3) of the reference magnetic resistors 40b through the annealing process accompanied with the outside magnetic field, the reference magnetic resistors 40b can have the mid-value resistance midway between the maximum resistance and the minimum resistance of the reference magnetic resistors 40b, e.g., the main magnetic resistors 40a after the annealing process.

Referring to FIGS. 3 and 6, a third interlayer insulating layer 41 is formed on the substrate face 11a including the magnetic resistors 40a and 40b thereon. The third interlayer insulating layer 41 is patterned to form main bit line contact holes 43a and reference bit line contact holes 43b that expose the main top electrodes 39a and the reference top electrodes 39b, respectively. A conductive layer such as a metal layer is formed on the substrate having the bit line contact holes 43a and 43b. The conductive layer is then patterned to form a plurality of main bit lines 45a and a reference bit line 45b that cross over the digit lines 21a. The main bit lines 45a are formed in the main cell regions A1 and A2, and the reference bit line 45b is formed in the reference cell region B. As a result, each of the main bit lines 45a is electrically connected to the main top electrodes 39a disposed in one of the columns through the main bit line contact holes 43a, and the reference bit line 45b is electrically connected to the reference top electrodes 39b one dimensionally disposed in the reference cell region B through the reference bit line contact holes 43b.

An operation of writing a data into one main cell selected from the MRAM cells according to some embodiments of the invention is achieved by forcing an appropriate current into the digit line 21a and the main bit line 43a, which are connected to the selected main cell. In this case, the magnetic spins in the main free layer 37a of the selected main cell may be arrayed to be parallel or anti-parallel with the fixed spins as shown in FIG. 6. However, the magnetic spins in the reference free layer 37b are arrayed toward a direction, which is perpendicular to the fixed spins, even after the writing operation.

Figure 7:
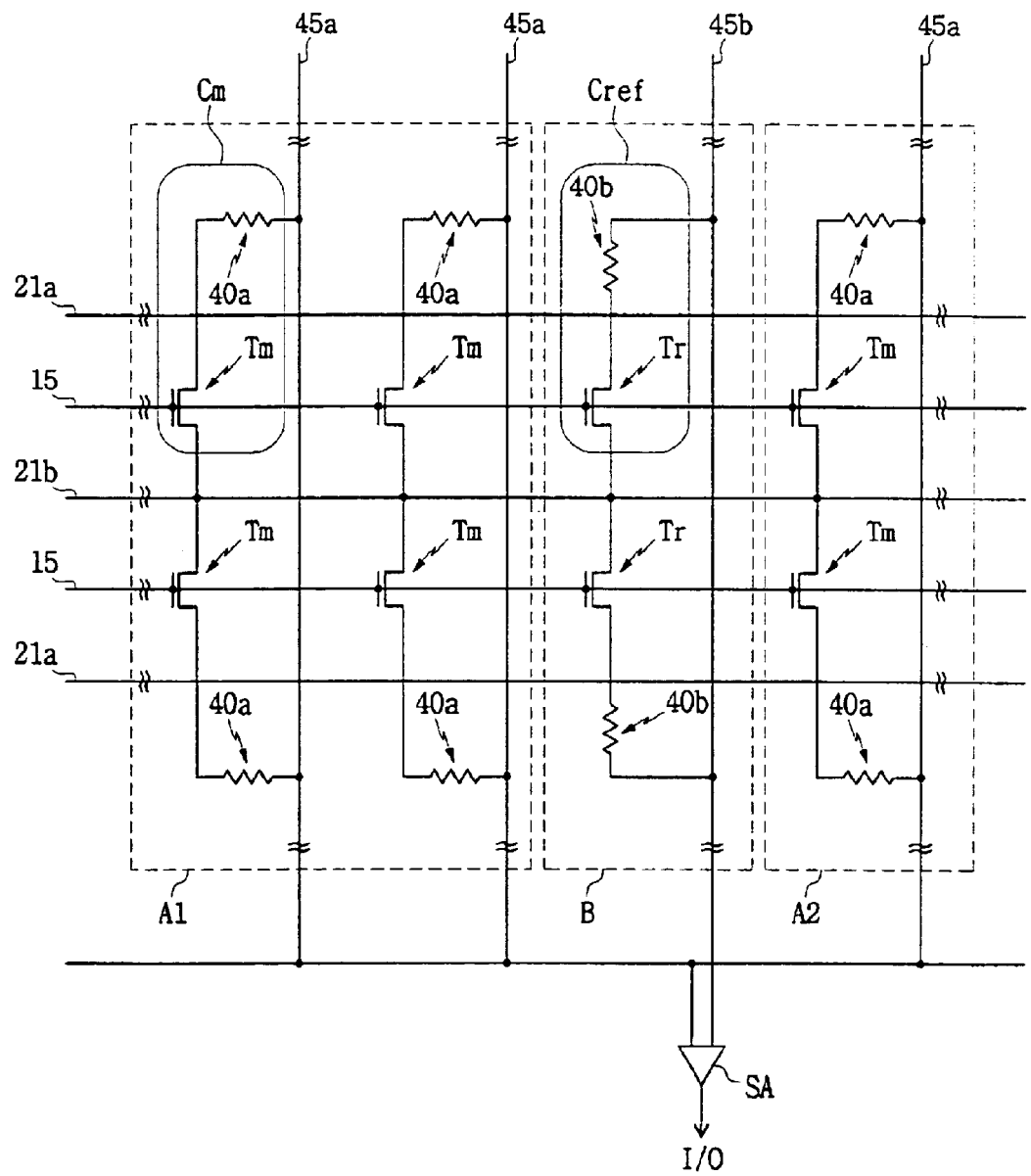
FIG. 7 is an equivalent circuit of a magnetic random access memory device shown in FIG. 3 including a sense amplifier connected thereto.

FIG. 7 is an equivalent circuit diagram of the MRAM device structure shown in FIG. 3 and a sense amplifier connected thereto.

As shown in FIG. 7, an MRAM device according to embodiments of the present invention comprises a cell array portion having a main cell array portion and a reference cell array portion B. The main cell array portion may be composed of a first main cell array portion A1 and a second main cell array portion A2, which are separated from each other. In this case, the reference cell array portion B may be located between the first and second main cell array portions A1 and A2.

The reference cell array portion B includes a reference bit line 45b. A plurality of reference cells $C_{ref}$ are connected in parallel with the reference bit line 45b. Each of the reference cells $C_{ref}$ comprises a single reference access transistor $T_r$ and a single reference magnetic resistor 40b, which are serially connected. Each reference magnetic resistor 40b has a first terminal and a second terminal. The first terminals of the reference magnetic resistors 40b are electrically connected to the reference bit line 45b, and the second terminals of the reference magnetic resistors 40b are electrically connected to the drain regions of the reference access transistors $T_r$ respectively. The reference bit line 45b is electrically connected to a first input port of a sense amplifier SA.

Gate electrodes of the reference access transistors $T_r$ are electrically connected to a plurality of word lines 15, respectively. The word lines 15 are extended into the first and second main cell array portions A1 and A2.

The main cell array portions A1 and A2 comprise a plurality of main bit lines 45a. The main bit lines 45a are electrically connected to a second input port of the sense amplifier SA. Thus, the sense amplifier SA compares a main cell current flowing through a selected one of the main bit lines 45a with a reference cell current flowing through the reference bit line 45b in a read mode, thereby generating an output signal that corresponds to a logic "1" or "0". The output signal of the sense amplifier SA is transmitted to an I/O (input/output) port.

A plurality of main cells $C_m$ is connected in parallel with the respective main bit lines 45a. Each of the main cells $C_m$ comprises a single main access transistor $T_m$ and a single main magnetic resistor 40a, which are serially connected. Each of the main magnetic resistors 40a also has a first terminal and a second terminal. The first terminals of the main magnetic resistors 40a are electrically connected to the main bit lines 45a, and the second terminals of the main magnetic resistors 40a are electrically connected to the drain regions of the main access transistors $T_m$, respectively. Also, gate electrodes of the main access transistors $T_m$ are electrically connected to the word lines 15. As a result, each of the word lines 15 is electrically connected to the main cells $C_m$ and one reference cell $C_{ref}$, which are arrayed in one row.

Source regions of the main access transistors $T_m$ and the reference access transistors $T_r$ are electrically connected to a common source line 21b. In addition, the main cell array portion comprises a plurality of digit lines 21a. The digit lines 21a extend into the reference cell array portion B. In some embodiments, each of the reference magnetic resistors 40b has a fixed reference resistance that corresponds to a mid-value midway between a maximum resistance and a minimum resistance of the main magnetic resistors 40a.

An operation of writing data into a selected one of the main cells $C_m$, according to some embodiments of the present invention, is achieved by forcing an appropriate current into a selected one of the digit lines 21a and a selected one of the main bit lines 43a. Thus, a main cell, which is connected to the selected digit line 21a and the selected main bit line 43a, is selected. As a result, the main magnetic resistor 40a of the selected main cell is magnetized to have a maximum resistance or a minimum resistance thereof.

Subsequently, a read operation can be achieved by applying a ground voltage to the common source line 21b, applying a reference voltage $V_{ref}$ to the reference bit line 45b and a selected one of the main bit lines 45a, and applying a power supply voltage $V_{cc}$ to a selected word line 15. In this case, a main cell, which is connected to the selected main bit line 45a and the selected word line 15, is selected. As a result, the main access transistor $T_m$ of the selected main cell is turned on, and a main cell current flows through the selected main bit line 45a. The amount of the main cell current is determined according to the resistance of the main magnetic resistor 40a of the selected main cell $C_m$. In other words, if the selected main magnetic resistor 40a has the maximum resistance, the main cell current has a minimum current value. In contrast, if the selected main magnetic resistor 40a has the minimum resistance, the main cell current has a maximum current value.

During the read operation, a reference cell connected to the selected word line 15 is also selected. Thus, the reference access transistor $T_r$ of the selected reference cell is turned on, and a reference cell current flows through the reference bit line 45b. In some embodiments, the reference magnetic resistors 40b of the reference cells $C_{ref}$ has a resistance that corresponds to a mid-value midway between the maximum resistance and the minimum resistance of the main magnetic resistors 40a. In this case, the reference cell current exhibits a mid-value midway between the maximum current value and the minimum current value. Accordingly, it is possible to increase or maximize the sensing margin of the sense amplifier SA in the read mode.

In some embodiments of the invention, the unit reference cell comprises a single reference access transistor and a single reference magnetic resistor, like the main cell. Therefore, it is possible to realize a compact cell array portion as compared to a conventional cell array portion including a unit reference cell that has two access transistors and four magnetic resistors. In other words, it is possible to increase the integration density of the MRAM device. Further, it is possible to realize reference cells having a mid-value midway between the maximum resistance and the minimum resistance of main cells. Thus, the sensing margin of the sense amplifier can be improved.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A magnetic random access memory (MRAM) device structure having a main cell region and a reference cell region adjacent to the main cell region, the MRAM device structure comprising:

a plurality of main magnetic resistors disposed in the main cell region along rows and columns, each of the main magnetic resistors having a first width and a first length when viewed from a plan view; and a plurality of reference magnetic resistors disposed in the reference cell region along a column, each of the reference magnetic resistors having a second width and a second length, a length direction of the reference magnetic resistors intersecting a length direction of the main magnetic resistors at a predetermined nonzero angle.

2. The MRAM device structure of claim 1, wherein the first and second lengths are greater than the first and second widths respectively, and each of the main magnetic resistors and the reference magnetic resistors has a rectangular shape or an oval shape when viewed from a plan view.

3. The MRAM device structure of claim 1, wherein each of the main magnetic resistors comprises a main bottom electrode, a main magnetic tunnel junction (MTJ) structure and a main top electrode, which are sequentially stacked, and each of the reference magnetic resistors comprises a reference bottom electrode, a reference MTJ structure and a reference top electrode, which are sequentially stacked.

4. The MRAM device structure of claim 3, wherein the main MTJ structure comprises a main pinning layer, a main pinned layer, a main tunneling layer and a main free layer, which are sequentially stacked, and the reference MTJ structure comprises a reference pinning layer, a reference pinned layer, a reference tunneling layer and a reference free layer, which are sequentially stacked.

5. The MRAM device structure of claim 1, wherein the predetermined nonzero angle is 90°.

6. The MRAM device structure of claim 1 further comprising a reference bit line disposed in the reference cell region, wherein the reference bit line is extends parallel to a column, and the reference bit line is electrically connected to top surfaces of the reference magnetic resistors which are one dimensionally arrayed along a column under the reference bit line.

7. The MRAM device structure of claim 1 further comprising a plurality of parallel main bit lines disposed in the main cell region, wherein the main bit lines are parallel to the columns, and each of the main bit lines is electrically connected to top surfaces of the main magnetic resistors which are one dimensionally arrayed along the column under the respective main bit lines.

8. The MRAM device structure of claim 1 further comprising a plurality of parallel digit lines disposed under the main magnetic resistors and the reference magnetic resistors, wherein the digit lines extend parallel to the rows and are insulated from the main magnetic resistors and the reference magnetic resistors.

9. The MRAM device structure of claim 1, further comprising:
a plurality of main access transistors in the main cell region and electrically connected to bottom surfaces of the main magnetic resistors, respectively; and
a plurality of reference access transistors in the reference cell region and electrically connected to bottom surfaces of the reference magnetic resistors, respectively.

10. The MRAM device structure of claim 9, wherein the main access transistors and the reference access transistor, which are arrayed in the respective rows, share a single word line.

11. A magnetic random access memory (MRAM) device structure including a main cell region and a reference cell region, which are defined in a semiconductor substrate, the main cell region having a plurality of main cells disposed along rows and columns, the reference cell region having a plurality of reference cells disposed along a column, the MRAM device structure comprising:
a plurality of digit lines extending parallel to the columns on the semiconductor substrate;
a plurality of main bit lines disposed in the main cell region, the main bit lines crossing over the digit lines;
a reference bit line disposed in the reference cell region, the reference bit line crossing over the digit lines;
a plurality of main magnetic resistors interposed between the main bit lines and the digit lines, each of the main magnetic resistors having a width and a length greater than the width when viewed from a plan view, the main magnetic resistors extending parallel to a single direction; and
a plurality of reference magnetic resistors interposed between the reference bit line and the digit lines, the reference magnetic resistors having same configuration and structure as the main magnetic resistors and extending perpendicular to the single direction.

12. The MRAM device structure of claim 11, wherein each of the main magnetic resistors and the reference magnetic resistors has a rectangular shape or an oval shape when viewed from a plan view.

13. The MRAM device structure of claim 11, wherein each of the main magnetic resistors comprises a main bottom electrode, a main magnetic tunnel junction (MTJ) structure and a main top electrode which are sequentially stacked, and each of the reference magnetic resistors comprises a reference bottom electrode, a reference MTJ structure and a reference top electrode which are sequentially stacked, the reference bit line being electrically connected to the reference top electrodes.

14. The MRAM device structure of claim 13, wherein each of the main MTJ structures comprises a main pinning layer, a main pinned layer, a main tunneling layer and a main free layer which are sequentially stacked, and each of the reference MTJ structures comprises a reference pinning layer, a reference pinned layer, a reference tunneling layer and a reference free layer which are sequentially stacked.

15. The MRAM device structure of claim 11, wherein the digit lines are insulated from the main magnetic resistors and the reference magnetic resistors.

16. The MRAM device structure of claim 13, wherein each of the main bit lines are electrically connected to the main top electrodes thereunder, and the reference bit line is electrically connected to the reference top electrodes thereunder.

17. The MRAM device structure of claim 13, further comprising:
a plurality of main access transistors having drain regions which are respectively connected to the main bottom electrodes; and
a plurality of reference access transistors having drain regions which are respectively connected to the reference bottom electrodes.

18. A Magnetic Random Access Memory (MRAM) comprising:
an MRAM substrate including a face;
a plurality of elongated main magnetic resistors that extend along the face; and
a plurality of elongated reference magnetic resistors that extend along the face nonparallel to the plurality of elongated main magnetic resistors.

19. The MRAM of claim 18 wherein the plurality of elongated reference magnetic resistors extend along the face orthogonal to the plurality of elongated main magnetic resistors.

20. The MRAM of claim 18 wherein the plurality of elongated reference magnetic resistors and the plurality of elongated main magnetic resistors are rectangular or oval shaped.

21. The MRAM of claim 18 wherein the plurality of elongated main magnetic resistors are configured to have a maximum resistance or a minimum resistance and wherein the plurality of elongated reference magnetic resistors are configured to have resistance between the maximum resistance and the minimum resistance.

22. The MRAM of claim 18 wherein the plurality of elongated main magnetic resistors are configured to have a maximum resistance or a minimum resistance and the wherein the plurality of elongated reference magnetic resistors are configured to have resistance midway between the maximum resistance and the minimum resistance.

23. The MRAM of claim 18 wherein the plurality of elongated reference magnetic resistors and the plurality of elongated main magnetic resistors each include a pinned layer having magnetic spins that are oriented parallel to one another along the face.

24. The MRAM of claim 18 further comprising:
a plurality of main access transistors, a respective one of which is connected to a respective one of the plurality of elongated main magnetic resistors to define a plurality of main cells, each of which comprises a single main access transistor and a single main magnetic resistor; and
a plurality of reference access transistors, a respective one of which is connected to a respective one of the plurality of elongated reference magnetic resistors to define a plurality of reference cells, each of which comprises a single reference access transistor and a single reference magnetic resistor.

25. The MRAM of claim 24 further comprising:
a common line;
a main bit line; and
a reference bit line;
wherein at least one of the main cells is connected between the common line and the main bit line and at least one of the reference cells is connected between the common line and the reference bit line.

26. The MRAM of claim 25 further comprising:
a word line;
wherein the at least one of the main cells that is connected between the common line and the main bit line and the at least one of the reference cells that is connected between the common line and the reference bit line are also connected to the word line.

27. The MRAM of claim 26 wherein the common line and the word line extend along the face parallel to one another and wherein the main bit line and the reference bit line extend along the face parallel to one another and nonparallel to the common line and the word line.

28. The MRAM according to claim 25 further comprising:
a sense amplifier that is connected between the main bit line and the reference bit line.

29. A Magnetic Random Access Memory (MRAM) comprising:
an MRAM substrate including a face thereon;
a plurality of elongated main magnetic resistors and a plurality of main access transistors on the substrate, the main magnetic resistors being configured to have a maximum resistance or a minimum resistance, a respective one of the main magnetic resistors being connected to a respective one of the plurality of main access transistors to define a plurality of main cells, each of which comprises a single main access transistor and a single main magnetic resistor; and
a plurality of elongated reference magnetic resistors and a plurality of reference access transistors on the substrate, the reference magnetic resistors being configured to have resistance between the maximum resistance and the minimum resistance, a respective one of the reference magnetic resistors being connected to a respective one of the plurality of reference access transistors to define a plurality of reference cells, each of which comprises a single reference access transistor and a single reference magnetic resistor,
wherein the plurality elongate main magnetic resistors extend along the face and the plurality of elongated reference magnetic resistor extend along the face nonparallel to the plurality of the elongated main magnetic resistor.

30. The MRAM of claim 29 wherein the plurality of elongated reference magnetic resistors extend along the face orthogonal to the plurality of elongated main magnetic resistors.

31. The MRAM of claim 29 wherein the plurality of elongated reference magnetic resistors and the plurality of elongated main magnetic resistors are rectangular or oval shaped.

32. The MRAM of claim 29 wherein the plurality of reference magnetic resistors are configured to have resistance midway between the maximum resistance and the minimum resistance.

33. The MRAM of claim 29 wherein the plurality of reference magnetic resistors and the plurality of main magnetic resistors each include a pinned layer having magnetic spins that are oriented parallel to one another.

34. The MRAM of claim 29 further comprising:
a common line;
a main bit line; and
a reference bit line;
wherein at least one of the main cells is connected between the common line and the main bit line and at least one of the reference cells is connected between the common line and the reference bit line.

35. The MRAM of claim 34 further comprising:
a word line;
wherein the at least one of the main cells that is connected between the common line and the main bit line and the at least one of the reference cells that is connected between the common line and the reference bit line are also connected to the word line.

36. The MRAM of claim 35 wherein the common line and the word line extend parallel to one another and wherein the main bit line and the reference bit line extend parallel to one another and nonparallel to the common line and the word line.

37. The MRAM according to claim 34 further comprising:
a sense amplifier that is connected between the main bit line and the reference bit line.

* * * * *